US012572086B2

(12) United States Patent
Liao et al.

(10) Patent No.:  US 12,572,086 B2
(45) Date of Patent:  Mar. 10, 2026

(54) APPARATUS FOR TREATING SUBSTRATE

(71) Applicant: TAIWAN SEMICONDUCTOR MANUFACTURING COMPANY, LTD., Hsinchu (TW)

(72) Inventors: Heng-Wei Liao, Hsinchu (TW); De-Fang Huang, Hsinchu (TW); Kuo-Hua Wang, Hsinchu (TW); Chih Yang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 124 days.

(21) Appl. No.: 18/667,310

(22) Filed: May 17, 2024

(65) Prior Publication Data

US 2025/0355372 A1     Nov. 20, 2025

(51) Int. Cl.
*G03F 7/00*       (2006.01)
*G03F 7/16*       (2006.01)

(52) U.S. Cl.
CPC .......... *G03F 7/70716* (2013.01); *G03F 7/168* (2013.01); *G03F 7/7075* (2013.01); *G03F 7/70875* (2013.01)

(58) Field of Classification Search
CPC .... G03F 7/70716; G03F 7/168; G03F 7/7075; G03F 7/70875; H01L 21/67772; H01L 21/67098
See application file for complete search history.

(56) References Cited

U.S. PATENT DOCUMENTS

| | | | | |
|---|---|---|---|---|
| 2009/0016859 A1* | 1/2009 | Asakawa | .......... | H01L 21/67727 |
| | | | | 414/222.11 |
| 2015/0227050 A1* | 8/2015 | Lin | .................. | H01L 21/67115 |
| | | | | 438/5 |

FOREIGN PATENT DOCUMENTS

| | | | | | |
|---|---|---|---|---|---|
| CN | 101140893 A | * | 3/2008 | ....... | H01L 21/67772 |

* cited by examiner

*Primary Examiner* — Peter B Kim
(74) *Attorney, Agent, or Firm* — Birch, Stewart, Kolasch & Birch, LLP

(57)         ABSTRACT

A treatment apparatus includes a treatment device, a cover, an actuation device, a force-transmission unit, a frame unit, and a translation mechanism. The treatment device has a carrying surface. The cover is disposed on and movable relative to the carrying surface. The actuation device includes a cylinder and a piston rod that extends along a rod axis. The piston rod is driven to move relative to the cylinder along the rod axis. The force-transmission unit is coupled to move with the piston rod along the rod axis The frame unit is movable in an upright direction and is fixed to the cover so as to permit the cover to move with the frame unit. The translation mechanism couples the force-transmission unit with the frame unit so as to translate movement of the force-transmission unit in a front-rear direction into movement of the frame unit in the upright direction.

20 Claims, 13 Drawing Sheets

APPARATUS FOR TREATING SUBSTRATE

BACKGROUND

In the manufacturing process of semiconductor devices, various apparatuses are utilized, such as lithographic apparatus, etcher, furnace, implantation apparatus, deposition apparatus, measuring apparatus, etc. During mass production of the semiconductor devices, each apparatus is regularly subjected to preventive maintenance (PM) so as to provide a chamber environment with less defect sources. The apparatuses are continuously optimized to prolong the service lifetime and shorten a PM cycle thereof, thereby reducing the cost of mass production.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
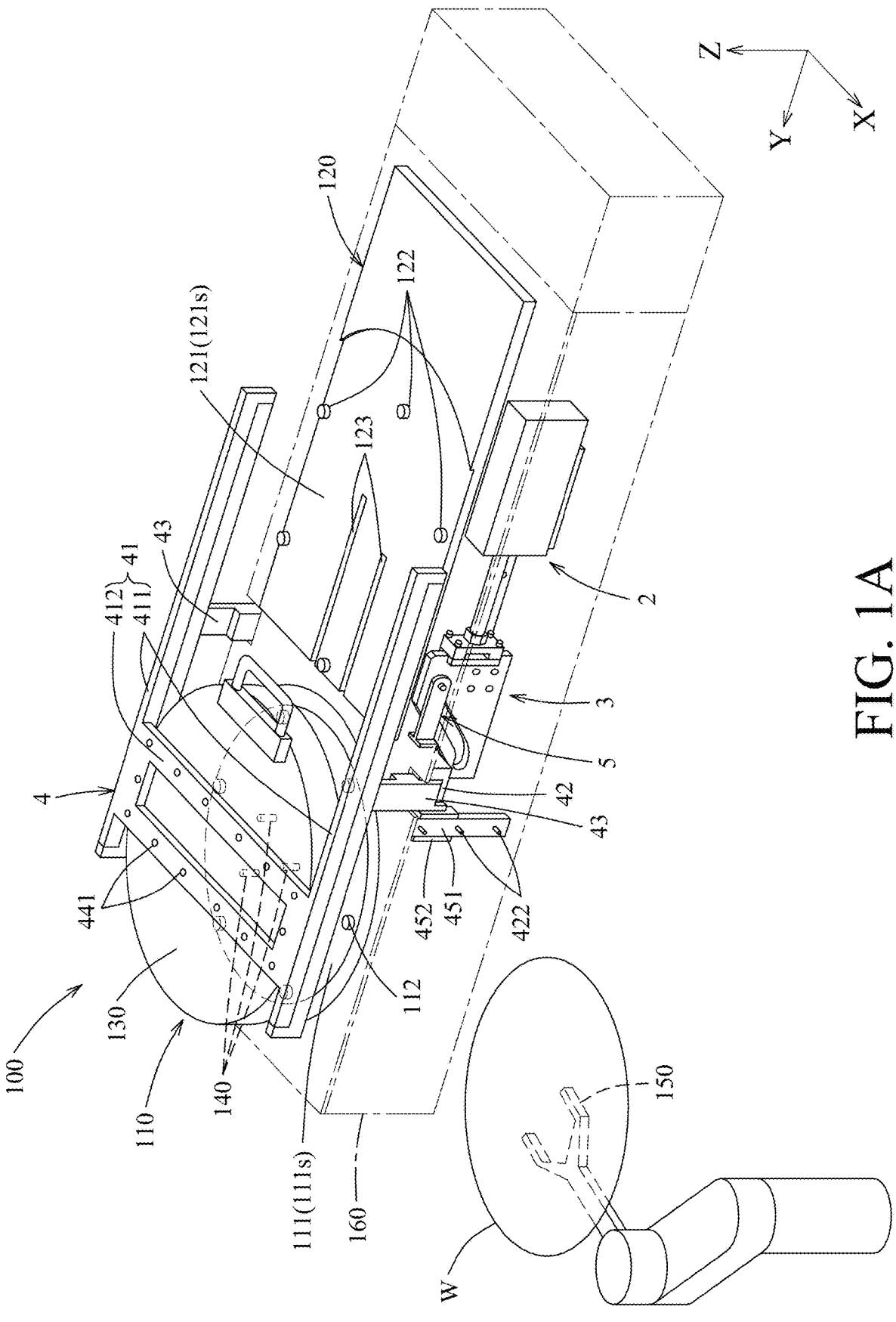
FIG. 1A is a schematic perspective view of a treatment apparatus in accordance with some embodiments, illustrating a cover thereof in an upper position being spaced apart from a carrier plate.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects ±10%, in some aspects +5%, in some aspects ±2.5%, in some aspects ±1%, in some aspects ±0.5%, and in some aspects ±0.1% from the specified amount, as such variations are appropriate to perform the disclosed methods or employ the disclosed compositions.

A photolithography process is a process for manufacturing a semiconductor device. In the photolithography process, a patterned photoresist is formed over a substrate (e.g., a wafer). After the photolithography process, an etching process may be performed to etch the substrate through the patterned photoresist, so that the pattern of the patterned photoresist is transferred to the substrate. Formation of the patterned photoresist may include the steps of photoresist coating, baking, alignment, exposure, and photoresist development. The photoresist coating, the baking and the photoresist development steps are carried out in a track system, and the alignment and exposure steps are carried out in a stepper system.

In a common practice, formation of the patterned photoresist includes multiple baking steps performed at different conditions (e.g., different temperatures and/or different time periods). For example, a substrate is heated in a first condition sufficient to remove moisture present on the substrate before proceeding to the photoresist coating step. After the photoresist coating step and before the alignment and exposure steps, a prebaking process is performed in a second condition to cure the photoresist spin-coated on the substrate. After the exposure step and before the photoresist development step, a post-exposure baking process is performed in a third condition to drive a small degree of diffusion of photoproducts within the exposed photoresist, thereby minimize the effects of standing wave periodic variations in exposure dose throughout the depth of the photoresist. After the photoresist development step, a hardbaking process is performed in a fourth condition to solidify remaining portions of the photoresist which are not removed during the photoresist development step. Each of the baking steps is followed by a cooling step to reduce the temperature of the substrate.

Sometimes, one of the baking steps (e.g., the post-exposure baking process) and a subsequent cooling step may be carried out in the same treatment apparatus, which has heating and cooling functions, so as to reduce the time period of the substrate being transferred between a heating device and a cooling device. It is found that if a friction force of an element that repeatedly slides in the treatment apparatus undesirably increases when the treatment apparatus was repeatedly operated, particles (or debris from wear) are likely to be produced in the environment for treating the substrate. In the case that the particles are accidentally attached to the substrate and are not removed before the etching process, which is performed after the photolithography process, the particles will transfer an undesirable pattern onto the substrate, ultimately adversely affecting the device performance of the semiconductor device to be formed.

Therefore, the present disclosure is directed to a treatment apparatus for treating a substrate (e.g., a wafer). Due to the structural design of the treatment apparatus, the particles are less likely to be produced during the operation thereof. The structural detail of the treatment apparatus will be described in detail in the following. In some embodiments, the treatment apparatus may be, for example, but not limited to, used in a photolithography process. For example, the treatment apparatus may be applied to a chilling hot plate process station (CHP) unit, or a precision chilling hot plate process station (PCH) unit used for a track system. Other applications suitable for the treatment apparatus after appropriate modification are also within the contemplated scope of the present disclosure.

Figure 1B:
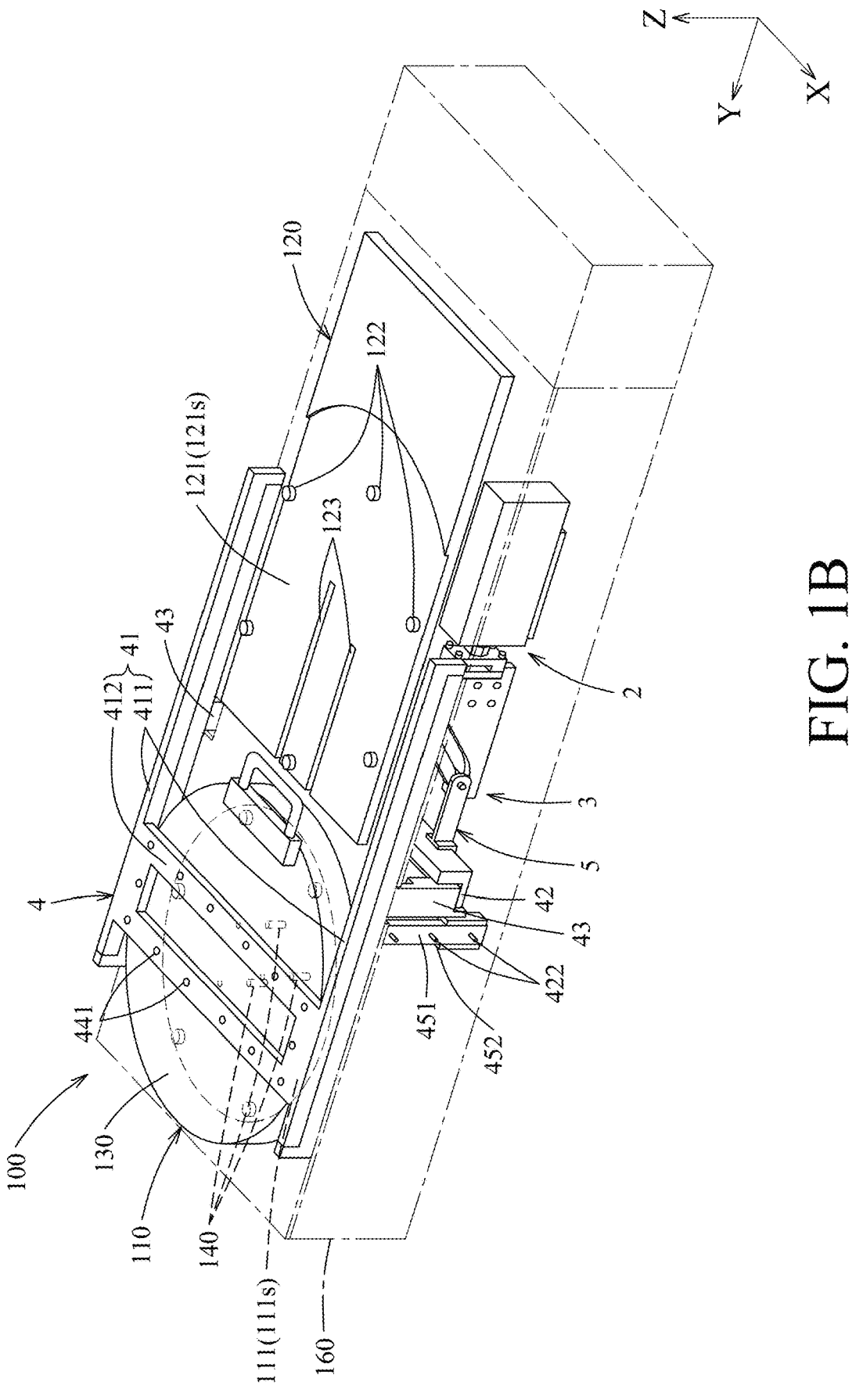
FIG. 1B is another schematic perspective view similar to that of FIG. 1A but illustrating the cover in a lower position being in seal contact with the carrier plate in accordance with some embodiments.

FIGS. 1A and 1B are respectively schematic perspective views illustrating a treatment apparatus 100 in different states in accordance with some embodiments. The treatment apparatus 100 includes a first treatment device 110 which includes a carrier plate 111 having a carrying surface 111*s*, and a cover 130 disposed on and movable relative to the carrying surface 111*s* between a lower position and an upper position. As shown in FIG. 1A, the cover 130 is in the upper position, where the cover 130 is spaced apart from the carrier plate 111 in an upright direction (Z). A shown in FIG.

1B, the cover 130 is in the lower position, where the cover 130 is in sealing contact with the carrier plate 111 to form a sealed chamber.

In some embodiments, the first treatment device 110 is configured as a heating device. The first treatments device 110 further includes a heater (not shown) which is located below the carrier plate 111. During a baking process, a wafer (which may be coated with a photoresist) is placed on the carrying surface 111*s*, and is baked in the sealed chamber by the heater. The carrier plate 111 may be referred to as a hot plate. In some embodiments, the first treatment device 110 is mounted in a casing 160 with the carrying surface 111*s* exposed therefrom.

In some embodiments not shown herein, an atmosphere control device is fluidly connected to the sealed chamber for controlling an atmosphere inside the seal chamber so as to permit solvent in the photoresist to be drawn out of the sealed chamber, and to permit the atmosphere inside the sealed chamber to be kept at a specific temperature and humidity.

Figure 2A:
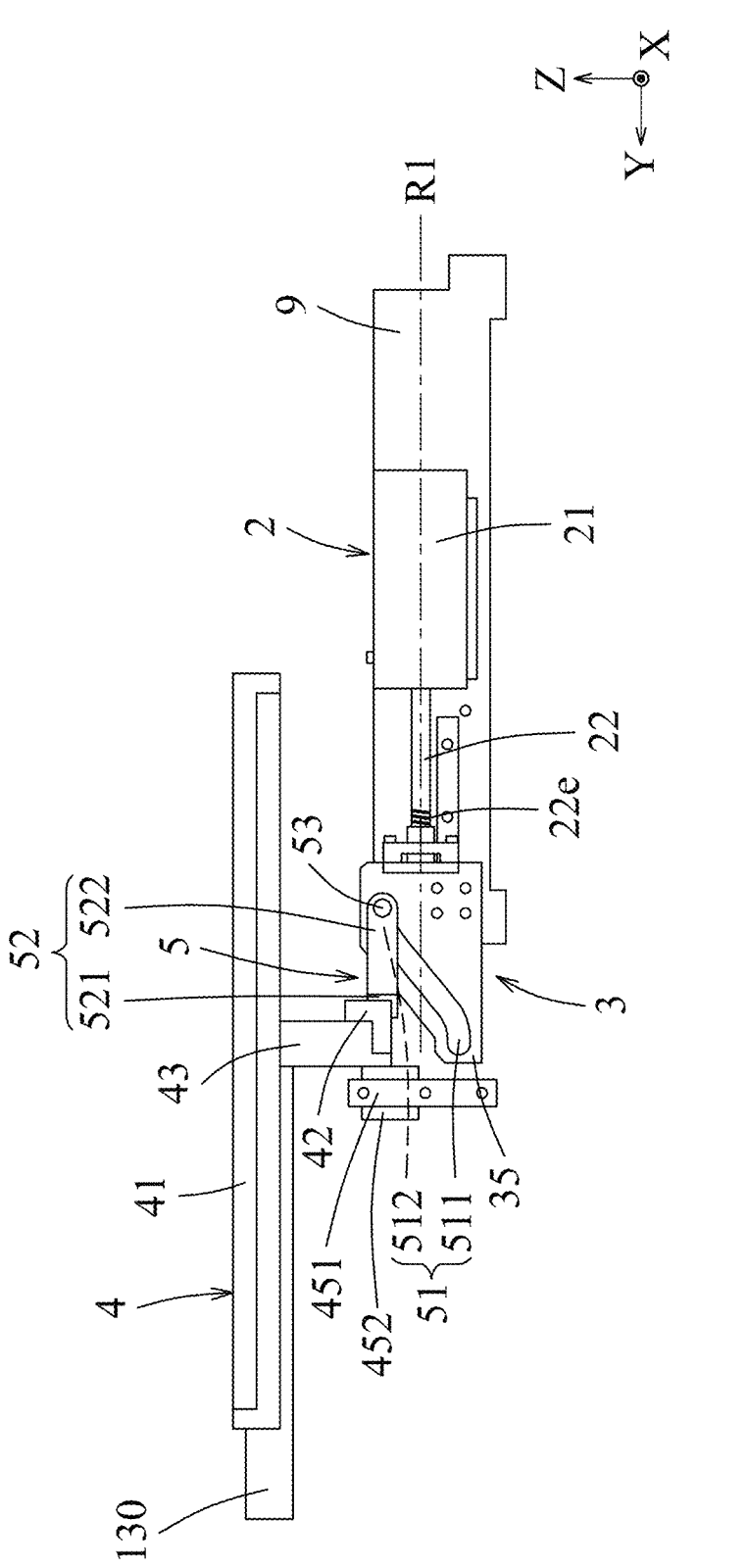
FIG. 2A is a schematic side view illustrating positions of an actuation device, a force-transmission unit, a frame unit and a translation unit of the treatment apparatus when the cover is in the upper position in accordance with some embodiments.
Figure 2B:
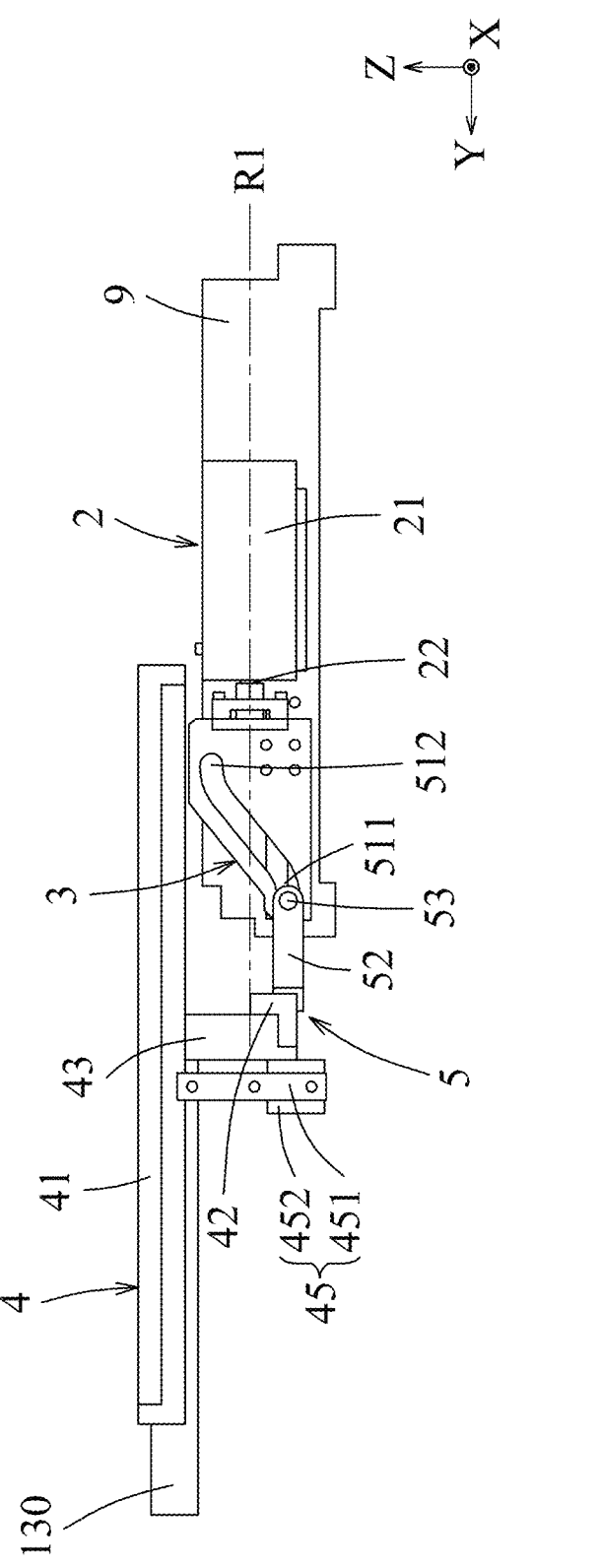
FIG. 2B is a schematic side view similar to FIG. 2A but illustrating the actuation device, the force-transmission unit, the frame unit and the translation unit being in other positions when the cover is in the lower position in accordance with some embodiments.
Figure 3:
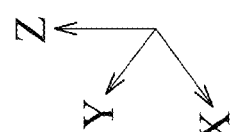
FIG. 3 is a perspective view illustrating the actuation device, the force-transmission unit, the translation mechanism and a lower portion of the frame unit in accordance with some embodiments.
Figure 4:
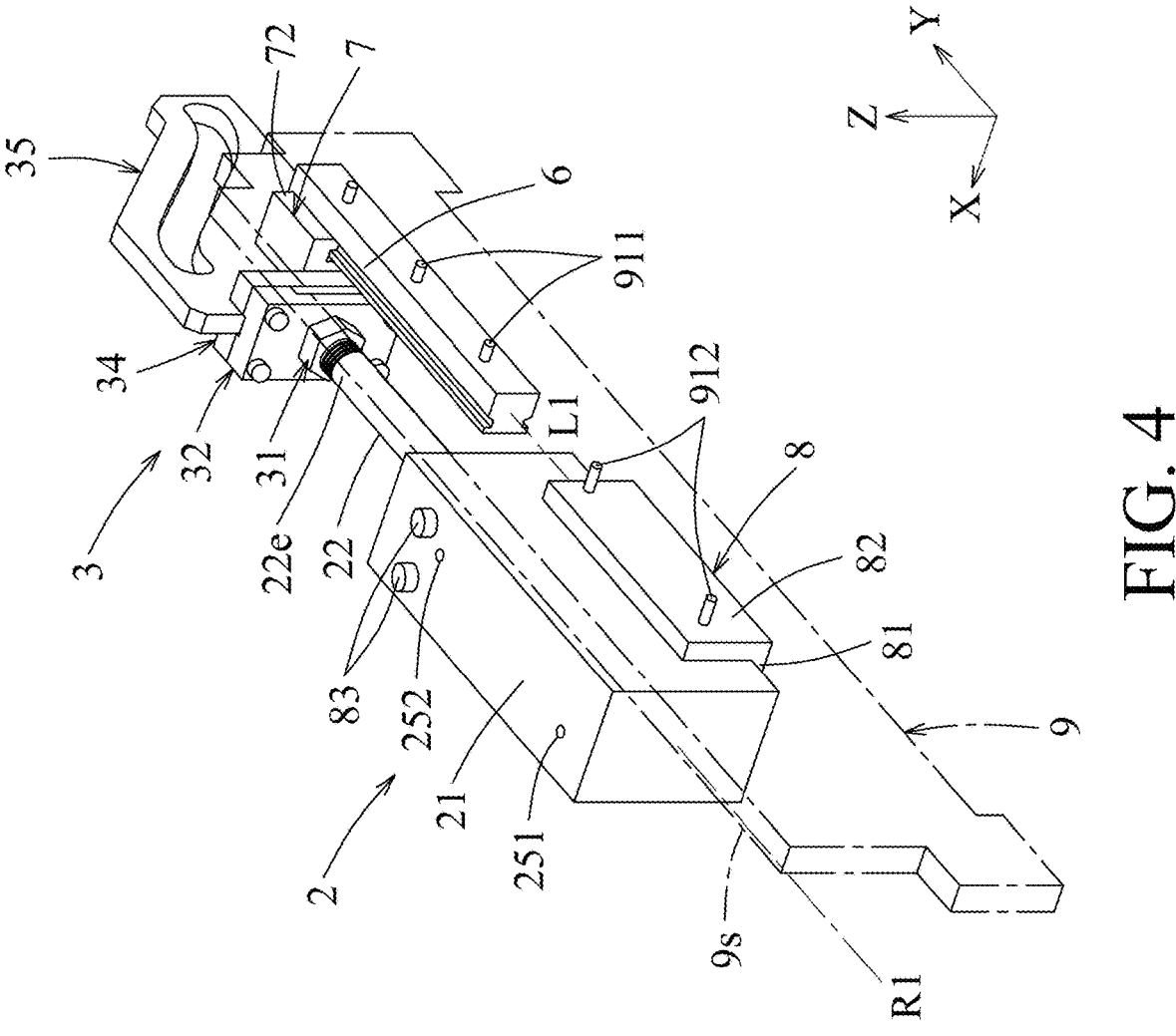
FIGS. 4 and 5 are respectively perspective views illustrating the actuation device and the force-transmission unit from different sides in accordance with some embodiments.
Figure 5:
Figure 5:
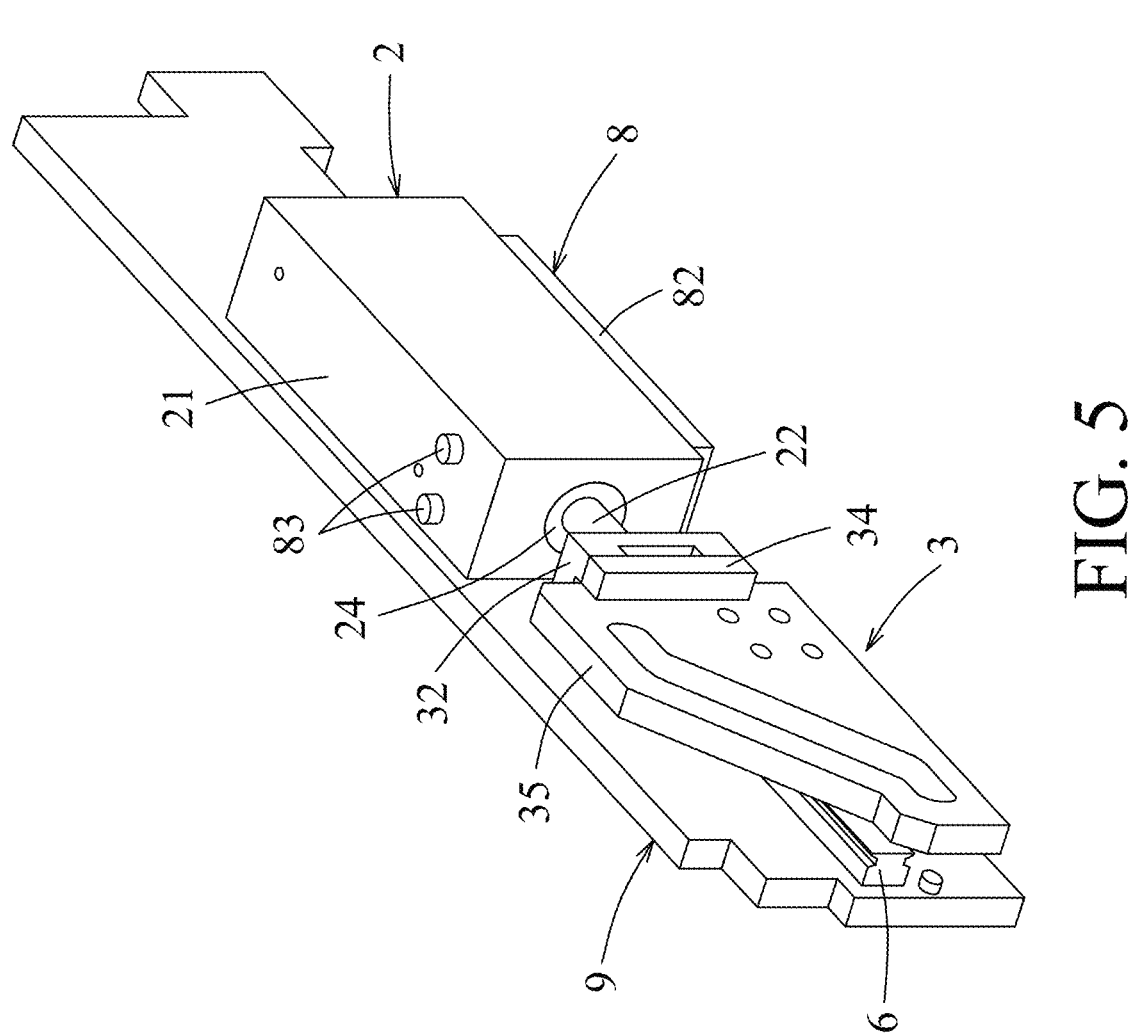
Figure 6:
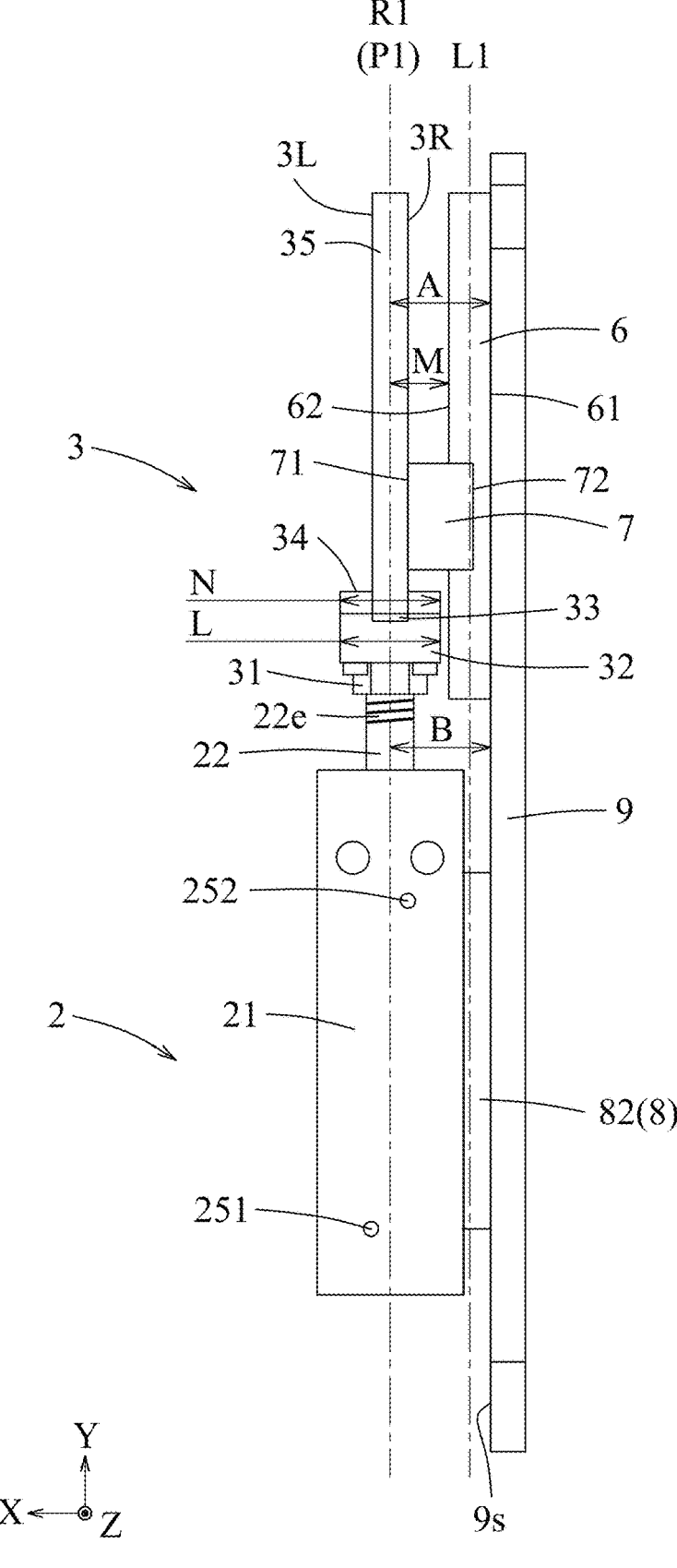
FIG. 6 is a schematic top view illustrating the actuation device and the force-transmission unit in accordance with some embodiments.

In some embodiments, the treatment apparatus 100 further include an actuation device 2, a force-transmission unit 3, a frame unit 4, and a translation mechanism 5. FIG. 2A is a schematic side view illustrating positions of the actuation device 2, the force-transmission unit 3, the frame unit 4 and the translation unit 4 of the treatment apparatus 100 when the cover 130 is in the upper position in accordance with some embodiments. FIG. 2B is a schematic fragmentary side view similar to FIG. 2A but illustrating the actuation device, the force-transmission unit, the frame unit and the translation unit being in other positions when the cover is in the lower position. In FIGS. 2A and 2B, the cover 130, the actuation device 2, the force-transmission unit 3, the frame unit 4, the translation mechanism 5 and a board 9 (will be described later) are shown, while other elements are omitted for the sake of clarity and brevity. FIG. 3 is a perspective view illustrating the actuation device 2, the force-transmission unit 3, the translation mechanism 5 and a lower portion of the frame unit 4 in accordance with some embodiments. FIGS. 4 and 5 are respectively perspective views illustrating the actuation device 2 and the force-transmission unit 3 from different sides in accordance with some embodiments. FIG. 6 is a schematic top view illustrating the actuation device 2 and the force-transmission unit 3 in accordance with some embodiments.

Referring to FIGS. 4 and 5, the actuation device 2 includes a cylinder 21 and a piston rod 22 that extends along a rod axis (R1) in a front-rear direction (Y) transverse to the upright direction (Z). The piston rod 22 is driven to move relative to the cylinder 21 along the rod axis (R1) between an extended position (see FIG. 2A) and a retracted position (see FIG. 2B). When the piston rod 22 is in the extended position, an outer end portion 22*e* of the piston rod 22 is distal from the cylinder 21. When the piston rod 22 is in the retracted position, the outer end portion 22*e* of the piston rod 22 is proximate to the cylinder 21. In some embodiments, the actuation device 2 is mounted inside the casing 160 (see FIGS. 1A and 1B).

Referring to FIGS. 4 and 5, the force-transmission unit 3 is coupled to move with the piston rod 22 along the rod axis (R1), and is movable between a forward position (see FIG. 2A), and a rearward position (see FIG. 2B). When the piston rod 22 is in the extended position, the force-transmission unit 3 is in the forward position. When the piston rod 22 is in the retracted position, the force-transmission unit 3 is in the rearward position.

Referring to FIG. 6, the force-transmission unit 3 has a left contour 3L and a right contour 3R which are opposite to each other in a left-right direction (X) and which are respectively located at two opposite sides of the rod axis (R1). The left-right direction (X) is transverse to both the front-rear direction (Y) and the upright direction (Z). In some embodiments, the left-right direction (X), the front-rear direction (Y) and the upright direction (Z) are perpendicular to each other. In some embodiments, the force-transmission unit 3 is mounted inside the casing 160 (see FIGS. 1A and 1B). In some embodiments, as shown in FIG. 6, the left contour 3L and the right contour 3R are symmetric with respect to a symmetric plane (P1) of the force-transmission unit 3. The rod axis (R1) passes through the force-transmission unit 3 and extends within the symmetric plane (P1). The symmetric plane (P1) is defined by the front-rear direction (Y) and the upright direction (Z).

Figure 7:
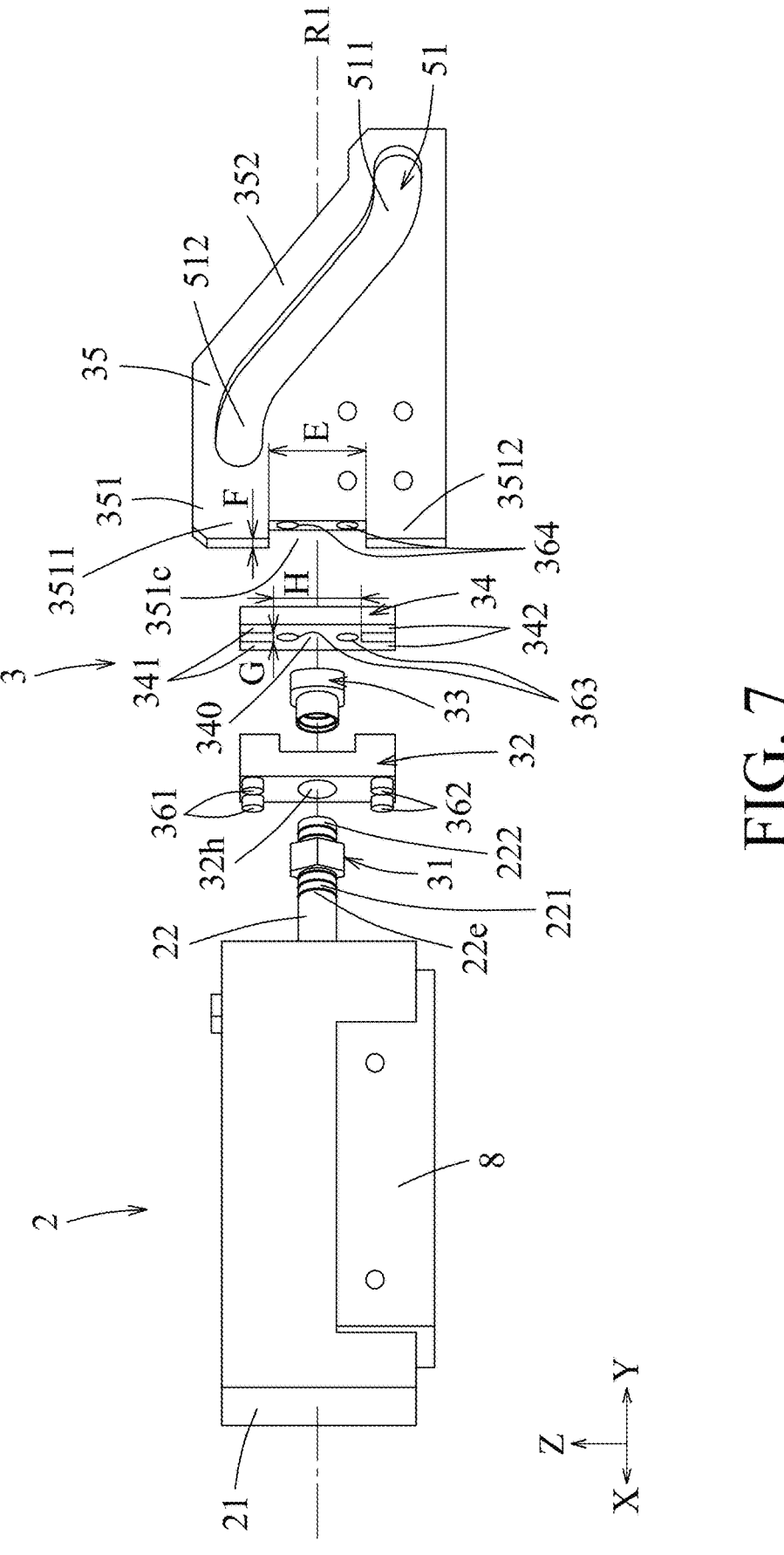
FIG. 7 is an exploded perspective view illustrating the actuation device and the force-transmission unit in accordance with some embodiments.

FIG. 7 is an exploded perspective view illustrating the actuation device 2 and the force-transmission unit 3 in accordance with some embodiments.

As shown in FIG. 7, the outer end portion 22e of the piston rod 22 has a first male-threaded region 221 and a second male-threaded region 222 disposed forwardly of the first male-threaded region 221. The force-transmission unit 3 includes a first engaging piece 31, a first coupling piece 32, a second engaging piece 33, a second coupling piece 34, and a guiding piece 35. As shown in FIG. 6, each of the first coupling piece 32, the second engaging piece 33, the second coupling piece 34, and the guiding piece 35 has two parts which are symmetric with respect to the symmetric plane (P1) of the force-transmission unit 3.

Figure 8:
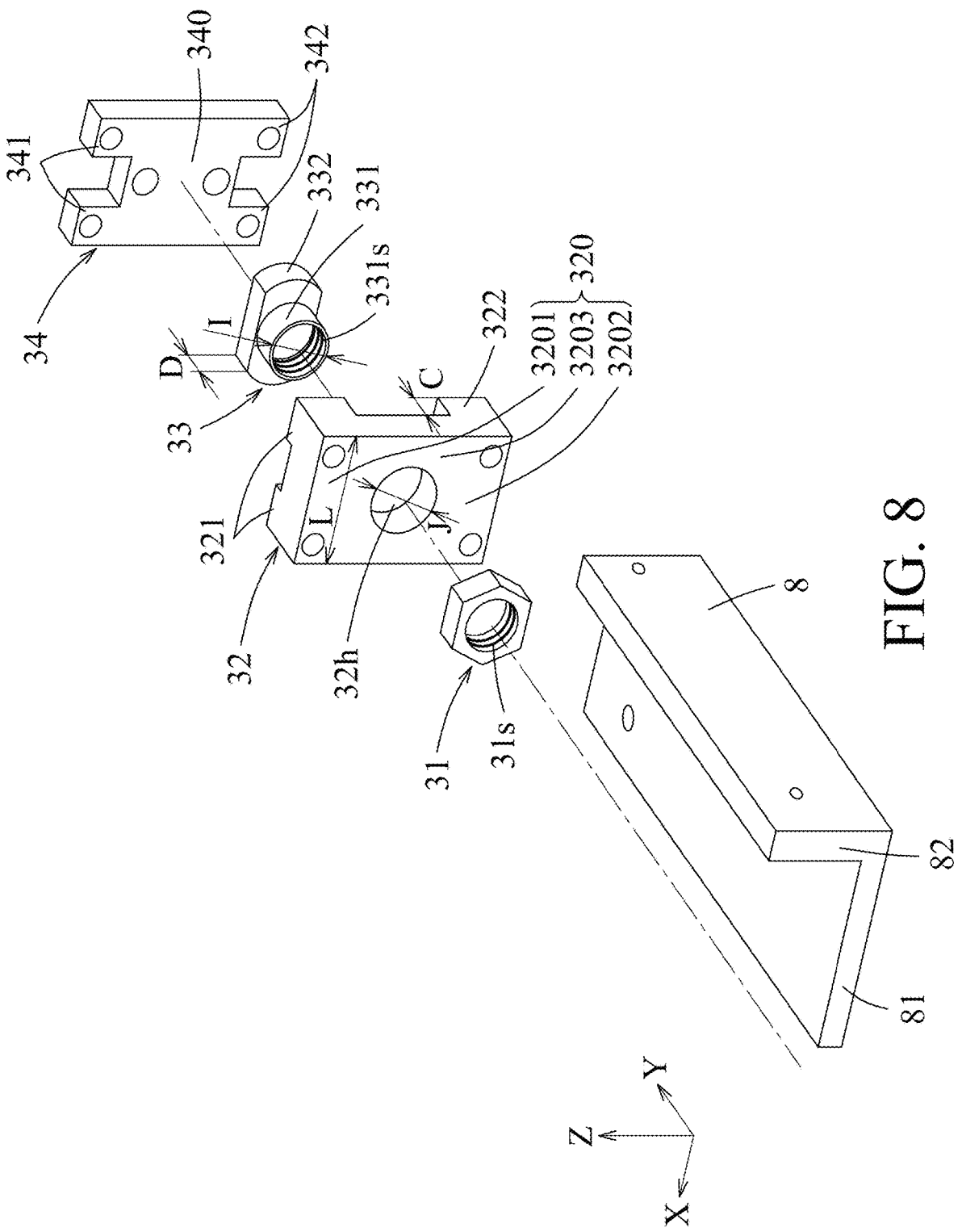
FIG. 8 is an exploded perspective view illustrating a first engaging piece, a first coupling piece, a second engaging piece, and a second coupling piece of the force-transmission unit and a base in accordance with some embodiments.
Figure 9:
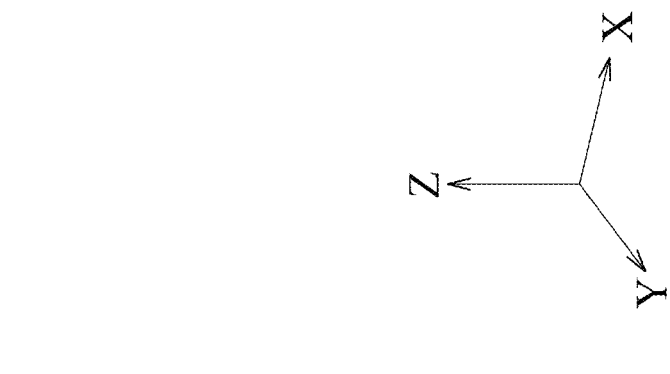
FIG. 9 is an exploded perspective view illustrating the first coupling piece, the second coupling piece and the base in accordance with some embodiments.
Figure 9:
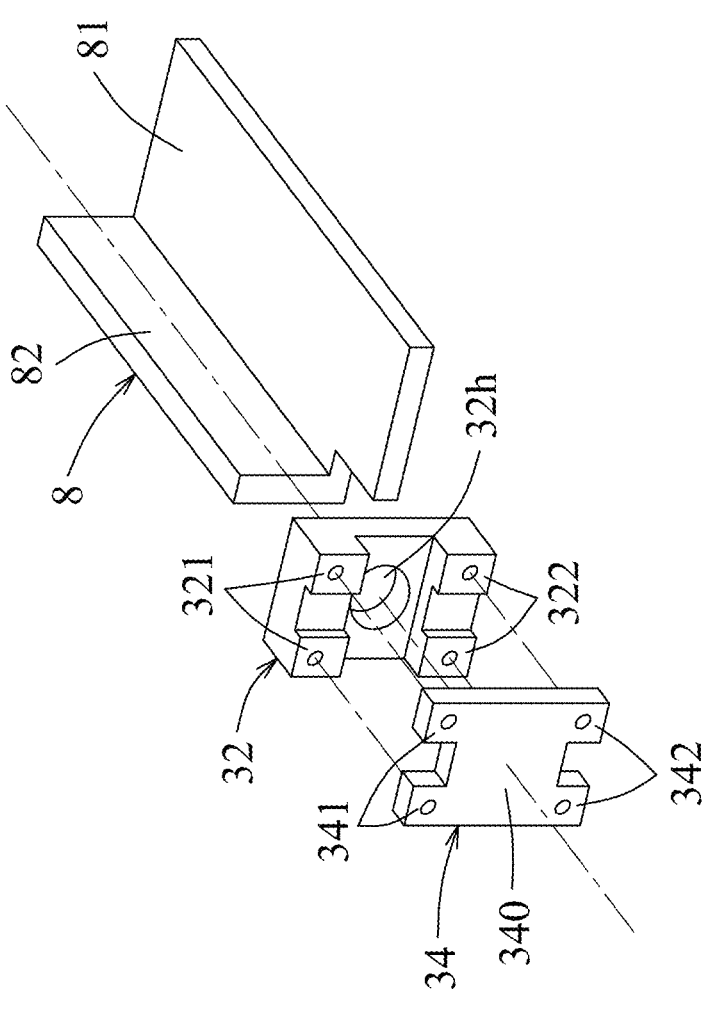

FIG. 8 is an exploded perspective view illustrating the first engaging piece 31, the first coupling piece 32, the second engaging piece 33, the second coupling piece 34, and a base 8 (described hereafter) in accordance with some embodiments. FIG. 9 is an exploded perspective view illustrating the first coupling piece 32, the second coupling piece 34 and the base 8 in accordance with some embodiments.

As shown in FIGS. 7 and 8, the first engaging piece 31 has a first female-threaded surface 31s which is around the rod axis (R1) when the first engaging piece 31 is mounted on the piston rod 22. The first female-threaded surface 31s is configured to permit the first engaging piece 31 to be in threaded engagement with the first male-threaded region 221, thereby allowing the first engaging piece 31 to be mounted on the piston rod 22. In some embodiments, the first engaging piece 31 is a hexagonal nut. In some embodiments not shown herein, the first engaging piece 31 is a nut with a round shape, a round top shape, a rectangular shape, a polygonal shape or other suitable shapes.

As shown in FIGS. 7 to 9, the first coupling piece 32 is disposed forwardly of the first engaging piece 31, and having a through hole 32h which has a hole dimension to permit the second male-threaded region 222 to be disposed in the through hole 32h, and to prevent the first engaging piece 31 from moving into the through hole 32h. In some embodiments, as shown in FIG. 8, the through hole 32h has an inner diameter (J) which is smaller than an outer dimension of the first engaging piece 31 and which is larger than an outer dimension of the second male-threaded region 222 (see FIG. 7). In some embodiments, the inner diameter (J) is smaller than a width (L) of the first coupling piece 32 in the left-right direction (X). The first coupling piece 32 includes a main plate 320, two upper ribs 321, and two lower ribs 322. The main plate 320 has an upper portion 3201, a lower portion 3202 and a middle portion 3203 which is located between the upper and lower portions 3201, 3202, and which is formed with the through hole 32h. The two upper ribs 321 extend forwardly from the upper portion 3201 of the main plate 320 by a distance (C) in the front-rear direction (Y) and which are spaced apart from each other in the left-right direction (X). The two lower ribs 322 extend forwardly from the lower portion 3202 of the main plate 320 by the distance (C) in the front-rear direction (Y) and which are spaced apart from each other in the left-right direction (X).

As shown in FIGS. 7 and 8, the second engaging piece 33 has a rear portion 331 and a front portion 332. The rear portion 331 has an inner surface formed with a second female-threaded surface 331s which is around the rod axis (R1) when the second engaging piece 33 is mounted on the piston rod 22. The second female-threaded surface 331s is configured to permit the rear portion 331 to extend into the through hole 32h and to be in threaded engagement with the second male-threaded region 222, thereby allowing the second engaging piece 33 to be mounted on the piston rod 22. In some embodiments, the front portion 332 has an outer dimension larger than the inner diameter (J) of the through hole 32h (see FIG. 8). In some embodiments, the rear portion 331 has an outer diameter (I) which is smaller than the inner diameter (J) of the through hole 32h so as to permit the rear portion 331 to be engaged within the through hole 32h. In some other embodiments, the rear portion 331 is fittingly engaged within the through hole 32h. The front portion 332 has a thickness (D) in the front-rear direction (Y). In some embodiments, the thickness (D) is substantially equal to the distance (C). In some embodiments not shown herein, the thickness (D) is less than the distance (C).

As shown in FIGS. 7 to 9, the second coupling piece 34 is disposed forwardly of the first coupling piece 32, and is fixed to the first coupling piece 32 so as to permit the front portion 332 of the second engaging piece 33 to be sandwiched between the first coupling piece 32 and the second coupling piece 34. The second coupling piece 34 includes a horizontal plate 340, two upper protrusions 341, and two lower protrusions 342. The horizontal plate 340 is configured to be in abutting engagement with the front portion 332 of the second engaging piece 33 so that the front portion 332 of the second engaging piece 33 is sandwiched between the horizontal plate 340 and the middle portion 3203 of the main plate 320 while the rear portion 331 of the second engaging piece 33 is engaged within the through hole 32h. The two upper protrusions 341 extend upwardly from the horizontal plate 340 so as to permit the two upper ribs 321 to be respectively fixed to the two upper protrusions 341 by two fasteners 361. The two lower protrusions 342 extend downwardly from the horizontal plate 340 so as to permit the two lower ribs 322 to be respectively fixed to the two lower protrusions 342 by two fasteners 362. Each of the fasteners 361, 362 may include screws, bolt/nut combinations, cotter pins, rivets, or any other suitable fastening mechanisms. A distance between the horizontal plate 340 and the middle portion 3203 of the main plate 320 is substantially equal to the distance (C). In the case that the thickness (D) of the front portion 332 of the second engaging piece 33 is not less than the distance (C), the front portion 332 of the second engaging piece 33 abuts against between the horizontal plate 340 and the middle portion 3203 of the main plate 320.

As shown in FIG. 7, the guiding piece 35 has a rear marginal portion 351 and a front guiding portion 352 which is opposite to the rear marginal portion 351 in the front-rear direction (Y). The rear marginal portion 351 has a cutout region 351c so as to permit the horizontal plate 340 to be engaged within the cutout region 351c. In some embodiments, the horizontal plate 340 is fixed in the cutout region 351*c* by two fasteners (not shown). In this case, the horizontal plate 340 is formed with two passing holes 363, and the rear marginal portion 351 is formed with two secured holes 364 in positions respectively corresponding to the passing holes 363 so as to permit the horizontal plate 340 to be fixed to the rear marginal portion 351 by the two fasteners. Each of the fasteners extends through one of the passing holes 363 to be secured within a respective one of the secured holes 364. The cutout region 351*c* has a length (E) in the upright direction (Z). The horizontal plate 340 has a height (H) in the upright direction (Z). The height (H) of the horizontal plate 340 is not greater than the length (E) of the cutout region 351*c*. The rear marginal portion 351 has an upper margin region 3511 and a lower margin region 3512 which are at two opposite sides of the cutout region 351*c* in the upright direction (Z) such that once the horizontal plate 340 is engaged within the cutout region 351*c*, the upper margin region 3511 is sandwiched between the two upper protrusions 341, and the lower margin region 3512 is sandwiched between the two lower protrusions 342. Each of the upper and lower margin regions 3511, 3512 has a width (F) in the left-right direction (X). The two upper protrusions 341 are spaced apart by a distance (G) in the left-right direction (X), and the two lower protrusions 342 are spaced apart by the distance (G). The distance (G) is not less than the width (F) of the upper and lower margin regions 3511, 3512. In some other embodiments, the horizontal plate 340 is fittingly engaged within the cutout region 351*c*.

Referring to FIGS. 1A, 1B, 2A and 2B, the frame unit 4 is movable in the upright direction (Z) and is fixed to the cover 130 to permit the cover 130 to move with the frame unit 4 in the upright direction (Z). In some embodiments, the frame unit 4 includes an upper frame 41, a lower frame 42 (which is fully shown in FIG. 3), and two interconnecting frames 43.

As shown in FIGS. 1A and 1B, the upper frame 41 is fixed to the cover 130 so as to permit the cover 130 to move with the upper frame 41, and has two marginal portions 411 which are opposite to each other in the left-right direction (X), and an interconnecting portion 412 which extends in the left-right direction (X) to interconnect the two marginal portions 411. In some embodiments, the interconnecting portion 412 is fixed to the cover 130 by fasteners 441. Examples of the fasteners 441 are similar to those of the fasteners 361, 362. In some embodiments, the upper frame 41 is disposed outside the casing 160 (see FIGS. 1A and 1B).

The lower frame 42 is disposed beneath the first treatment device 110. As shown in FIG. 3, the lower frame 42 has two marginal portions 421 which are opposite to each other in the left-right direction (X). In some embodiments, the lower frame 42 is disposed inside the casing 160 (see FIGS. 1A and 1B).

As shown in FIGS. 1A and 3, each of the interconnecting frames 43 interconnects one of the marginal portions 411 of the upper frame 41 with a respective one of the marginal portions 421 of the lower frame 42. In some embodiments, the interconnecting frames 43 extends through and is movable relative to the casing 160 (see FIGS. 1A and 1B).

Referring to FIGS. 1A, 1B, 2A and 2B, the translation mechanism 5 couples the force-transmission unit 3 with the frame unit 4 so as to translate movement of the force-transmission unit 3 in the front-rear direction (Y) into movement of the frame unit 4 in the upright direction (Z)

The translation mechanism 5 includes a guiding groove 51 (see also FIG. 7), a holding element 52, and an engaging finger 53.

The guiding groove 51 is formed in the guiding piece 35, and has a front groove end 511 and a rear groove end 512 that is at a level higher than a level of the front groove end 511. The holding element 52 extends in the front-rear direction (Y) to terminate at a front holding end 521 and a rear connecting end 522. The front holding end 521 is configured to hold the lower frame 42. The engaging finger 53 extends from the rear connecting end 522 in the left-right direction (X) and is slidably engaged within the guiding groove 51, such that in response to movement of the force-transmission unit 3 from the rearward position (see FIG. 2B) to the forward position (see FIG. 2A), the engaging finger 53 slides from the front groove end 511 to the rear groove end 512, and the lower frame 42 is lifted up by the holding element 52, thereby moving the cover 130 to the upper position.

In some embodiments, as shown in FIG. 3, the treatment apparatus 100 further includes two guiding mechanisms 45 which are opposite to each other in the left-right direction (X). Each of the guiding mechanisms 45 includes a guiding rail 451 and a slider 452. The guiding rail 451 is immovably mounted to an inner surface of the casing 160 by fasteners 442 (see FIG. 1A), and extends along the upright direction (Z). The slider 452 has a mount surface 4501 mounted to a respective one of the interconnecting frames 43 by fasteners 443, and a guided surface 4502 opposite to the mount surface 4501. The guided surface 4502 is slidably engaged with the guiding rail 451. In response to movement of the frame 4, the slider 452 is guided by the guiding rail 451 so as to permit the frame 4 to be guided by the slider 452 and the guiding rail 451 to move along the upright direction (Z).

As shown in FIGS. 4 and 5, the treatment apparatus 100 further includes a guiding rail 6, a slider 7, a base 8, and a board 9.

The guiding rail 6 is immovably mounted relative to the cylinder 21, and extends along a longitudinal axis (L1) in the front-rear direction (Y). The longitudinal axis (L1) is parallel to and offset from the rod axis (R1). As shown in FIG. 6, the guiding rail 6 has a first surface 61 mounted to the board 9 and a second surface 62 opposite to the first surface 62 in the left-right direction (X). A distance (M) in the left-right direction (X) between the rod axis (R1) and the second surface 62 is greater than a half of the width (L) of the first coupling piece 32. Furthermore, the distance (M) is greater than a half of a width (N) of the second coupling piece 34.

The slider 7 has a mount surface 71 and a guided surface 72 opposite to the mount surface 71. The guided surface 72 is slidably engaged with the guiding rail 6. The mount surface 71 is mounted to the force-transmission unit 3 such that in response to movement of the force-transmission unit 3, the slider 7 is guided by the guiding rail 6 so as to permit the force-transmission unit 3 to be guided by the slider 7 and the guiding rail 6 to move along the rod axis (R1).

The base 8 includes a base plate 81 on which the cylinder 21 is immovably mounted, and a side plate 82 extending upwardly from the base plate 81, as shown in FIG. 4. In some embodiments, the cylinder 21 is mounted on the base plate 81 by fasteners 83. Examples of the fasteners 83 are similar to those of the fasteners 361, 362.

The board 9 is immovably mounted inside the casing 160 (see FIGS. 1A and 1B) and has a mount surface 9*s*, as shown in FIG. 4. In some embodiments, the guiding rail 6 and the side plate 82 are mounted to the mount surface 9*s*. In some embodiments, the guiding rail 6 is mounted to the board 9 by fasteners 911. In some embodiments, the side plate 82 is mounted to the board 9 by fasteners 912. The mount surface 9s is arranged parallel to the symmetric plane (P1), as shown in FIG. 6. Furthermore, a distance (B) in the left-right direction (X) between the symmetric plane (P1) and the mount surface 9s of the board 9 is the same with a distance (A) in the left-right direction (X) between the rod axis (R1) and the mount surface 9s of the board 9. Examples of the fasteners 911, 912 are similar to those of the fasteners 361, 362.

Figure 10:
FIG. 10 is a schematic cross-sectional view illustrating a portion of the actuation device in accordance with some embodiments.

FIG. 10 is a schematic cross-sectional view illustrating a portion of the actuation device 2 in accordance with some embodiments.

The cylinder 21 has an inner space 21s therein. The actuation device 2 further includes a piston 23 and a seal 24, and is formed with two communication holes 251, 252. The piston 23 is disposed inside the inner space 21s to divide the inner space 21s into a first chamber 211 and a second chamber 212. The communication holes 251, 252 are formed to penetrate a cylinder wall of the cylinder 21 so as to permit a pressure control unit (not shown) to be in fluid communication with the first and second chambers 211, 212 through the communication holes 251, 252, respectively. As such, pressures inside the first and second chambers 211, 212 can be controlled by the pressure control unit. The piston 23 has a surface 23s from which the piston rod 22 extends in the second chamber 212 through the cylinder 21. The seal 24 is disposed between the piston rod 22 and the cylinder wall of the cylinder 21 to seal the second chamber 212. When the pressure inside the first chamber 211 is greater than the pressure inside the second chamber 212, the piston rod 22 is driven to move to the extended position (see FIG. 2A), and when the pressure inside the first chamber 211 is less than the pressure inside the second chamber 212, the piston rod 22 is driven to move to the retracted position (see FIG. 2B). The pressure inside the chamber 211 (or 212) may be controlled using the pressure control unit by injecting a gas flow into the chamber 211 (or 212) to increase the pressure therein or pumping out the gas in the chamber 211 (or 212) to decrease the pressure therein through the respective communication hole 251 (or 252). When the piston rod 22 is driven to move between the extended position and the retracted position, a friction is present between the seal 24 and the piston rod 22. As shown in FIG. 6, since the rod axis (R1) of the piston rod 22 extends within the symmetric plane (P1) of the force-transmission unit 3, a force generated by the actuation device 2 is more inclined to be fully transmitted to the front-transmission unit 3 along the rod axis (R1), and will not act on the force-transmission unit 3 along the left-right direction (X) as a force component. As such, compared with the case that the rod axis is offset from the symmetric plane, the friction between the seal 24 and the piston rod 2 may be significantly minimized, thereby alleviating or eliminating the generation of particles due to wear of the seal 24.

Referring to FIG. 1A again, in some embodiments, the treatment apparatus further includes a second treatment device 120 including a carrier plate 121 having a carrying surface 121s. In some embodiments, the second treatment device 120 is configured as a cooling device. The second treatment device 120 further includes a cooler (not shown) which is equipped below the carrier plate 121, such that a wafer placed on the carrying surface 121s may be cooled to a certain temperature by the cooler. In some embodiments, the cooler may include a flow channel with a cooling liquid such as cooling water, or other suitable coolant flowing therein. In some embodiments, the second treatment device 120 is movably mounted on the casing 160 along the front-rear direction (Y).

In some embodiments, the treatment apparatus 100 further includes pins 140 which are movably mounted in the carrier plate 111 between a normal position, where the pins 140 are retracted relative to the carrying surface 111s, and a protruded position, where the pins 140 are protruded up from the carrying surface 111s. Therefore, a substrate (e.g., a wafer (W)) may be lifted up or lowered down by the pins 140. For example, the wafer (W) is lifted to be spaced apart from the carrying surface 111s when the pins 140 are in the protruded position, and the wafer (W) is lowered down when the pins 140 are actuated from the protruded position toward the normal position.

In some embodiments, each of the carrier plates 111, 121 is equipped with wafer guides 112 or 122 such that a wafer (W) placed on the carrying surface 111 or 121 may be self-aligned to be located between the wafer guides 112 or 122 without misalignment.

In some embodiments, the carrier plate 121 is formed with slits 123 such that when the second treatment device 120 is moved onto the carrying surface 111s, each of the pins 140 is received within a corresponding one of the slits 123.

In some embodiments, the treatment apparatus 100 further includes a robot 150 which is configured to hold a bottom of a wafer (W) so as to place the wafer (W) on the carrying surface 111s when the pins 140 are in the protruded position and the cover 130 is in the upper position.

In some embodiments, during operation of the treatment apparatus 100, a wafer (W) supported by the robot 150 is first placed above the carrying surface 111s when the cover 130 is in the upper position and the pins 140 are in the protruded position. After the robot 150 is removed from the wafer (W) and the pins 140 are actuated to the normal position, the wafer (W) is left on the carrying surface 111s. Next, the cover 130 is actuated from the upper position to the lower portion to be in sealing contact with the carrier plate 111, and then the wafer (W) is baked in the sealed chamber by the heating device 110. After the baking process, the cover 130 is actuated from the lower position to the upper position and the wafer (W) is lifted up to be spaced apart from the carrying surface 111s by movement of the pins 140 from the normal position to the protruded position. Thereafter, the cooling device 120 is actuated to move onto the carrying surface 111s without being interfered by the pins 140, and then the wafer (W) is put down onto the carrying surface 121s in response to movement of the pins 140 from the protruded position to the normal position. As such, the wafer (W) may be cooled by the cooling device 120 after the cooling device 120 moves outside the heating device 110. After the cooling process, the wafer (W) may be transferred back to the heating device 110 and then transferred out of the treatment apparatus 100 by the robot 150 in a reverse way.

Figures 11, 12:
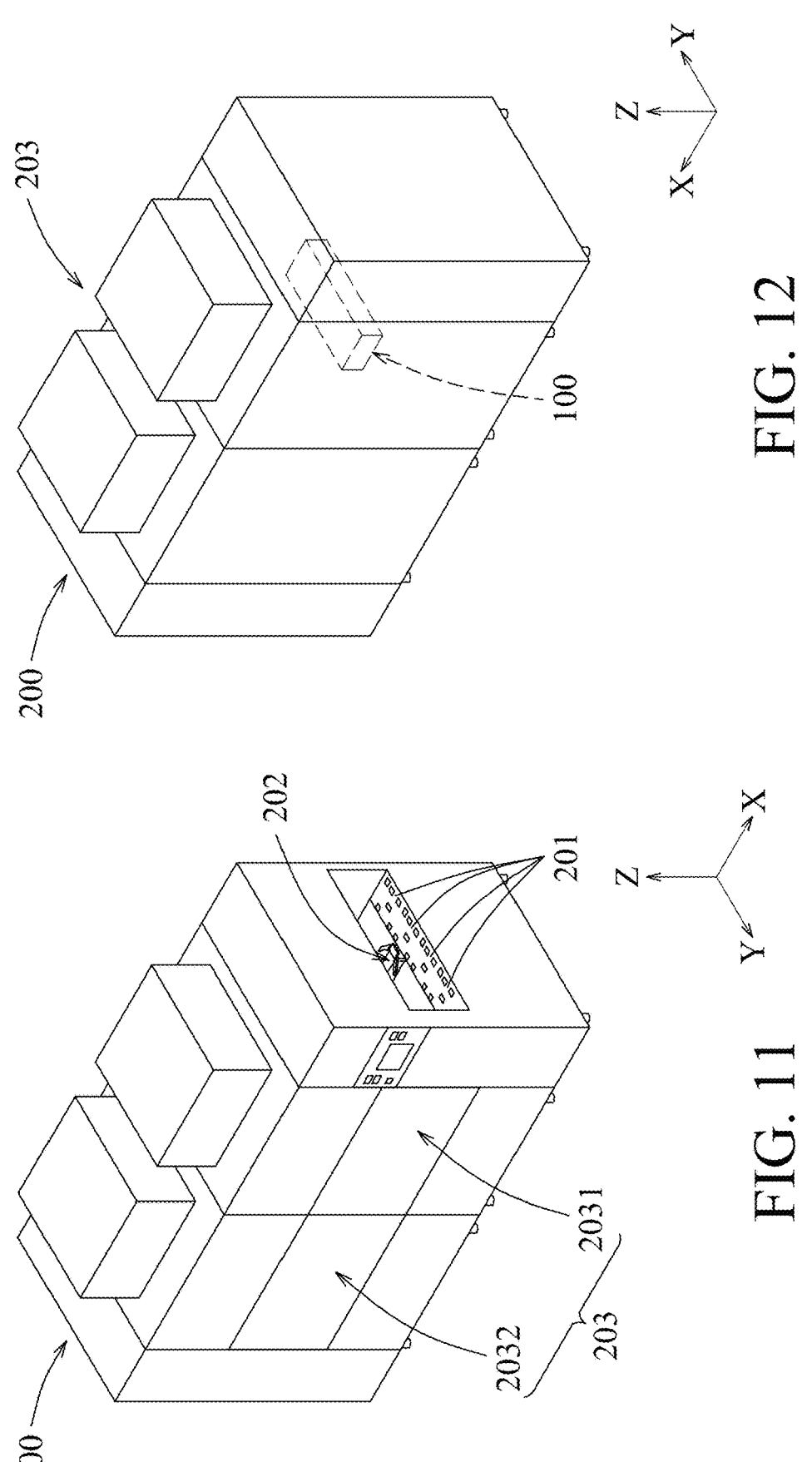
FIGS. 11 and 12 are respectively a front-side perspective view and a rear-side perspective view illustrating a track system including the treatment apparatus in accordance with some embodiments.

FIGS. 11 and 12 are respectively a front-side perspective view and a rear-side perspective view illustrating a track system 200 including the treatment apparatus 100 in accordance with some embodiments.

The track system 200 includes at least one load port 201 (four of which are shown in FIG. 11), at least one transfer robot arm 202 and a processing station 203.

The load ports 201 are configured to load and unload a wafer cassette (not shown) which is configured to store a plurality of wafers. The transfer robot arm 202 is configured to transfer each wafer between the wafer cassette and the processing station 203. The processing station 203 includes at least one coater unit 2031 for spin-coating a photoresist on a wafer, at least one developer unit 2032 for removing portions of the photoresist after exposure, and at least one the treatment apparatus 100 having heating and cooling functions. Other apparatuses suitable for installing in the track system 200 are within the contemplated scope of the present disclosure. For example, the track system 200 may further include at least one hot plate unit (not shown) for heating the wafer, and at least one cooling unit (not shown) for cooling the wafer.

In some alternative embodiments, the treatment apparatus 100 or the track system 200 may further include additional features, and/or some features present in the treatment apparatus 100 or the track system 200 may be modified, replaced, or eliminated without departure from the spirit and scope of the present disclosure.

In summary, with the provision of the piston rod 22 and the force-transmission unit 3 of the present disclosure, the friction between the seal 24 and the piston rod 22 can be significantly minimized because the rod axis (R1) of the piston rod 22 passes through the force-transmission unit 3 and extends within the symmetric plane (P1) of the force-transmission unit 3. That is, a force from the piston rod 22 passes through a geometric center of the force-transmission unit 3. Therefore, the service lifetime of the actuation device 2 can be significantly prolonged, thereby reducing the manufacturing cost of semiconductor device.

In accordance with some embodiments of the present disclosure, a treatment apparatus includes a treatment device, a cover, an actuation device, a force-transmission unit, a frame unit, and a translation mechanism. The treatment device has a carrying surface. The cover is disposed on and movable relative to the carrying surface between a lower position, where the cover is in sealing contact with the carrying surface to form a sealed chamber, and an upper position, where the cover is spaced apart from the carrying surface in an upright direction. The actuation device includes a cylinder and a piston rod that extends along a rod axis in a front-rear direction transverse to the upright direction. The piston rod is driven to move relative to the cylinder along the rod axis between an extended position, where an outer end portion of the piston rod is distal from the cylinder, and a retracted position, where the outer end portion of the piston rod is proximate to the cylinder. The force-transmission unit is coupled to move with the piston rod along the rod axis, and is movable between a forward position, where the piston rod is in the extended position, and a rearward position, where the piston rod is in the retracted position. The force-transmission unit has a left contour and a right contour which are opposite to each other in a left-right direction and which are respectively located at two opposite sides of the rod axis. The left-right direction is transverse to the front-rear direction and the upright direction. The frame unit is movable in the upright direction and is fixed to the cover so as to permit the cover to move with the frame unit in the upright direction. The translation mechanism couples the force-transmission unit with the frame unit so as to translate movement of the force-transmission unit in the front-rear direction into movement of the frame unit in the upright direction.

In accordance with some embodiments of the present disclosure, the left contour and the right contour are symmetric with respect to a symmetric plane of the force-transmission unit. The rod axis passes through the force-transmission unit and extends within the symmetric plane.

In accordance with some embodiments of the present disclosure, the outer end portion of the piston rod has a first male-threaded region and a second male-threaded region disposed forwardly of the first male-threaded region. The force-transmission unit includes a first engaging piece, a first coupling piece, a second engaging piece, a second coupling piece, and a guiding piece. The first engaging piece has a first female-threaded surface which is configured to permit the first engaging piece to be in threaded engagement with the first male-threaded region. The first coupling piece is disposed forwardly of the first engaging piece, and has a through hole which has a dimension to permit the second male-threaded region to be disposed in the through hole, and to prevent the first engaging piece from moving into the through hole. The second engaging piece has a rear portion and a front portion. The rear portion has a second female-threaded surface which is configured to permit the rear portion to extend into the through hole and to be in threaded engagement with the second male-threaded region. The front portion has an outer dimension larger than the dimension of the through hole; a second coupling piece which is disposed forwardly of and fixed to the first coupling piece so as to permit the front portion of the second engaging piece to be sandwiched between the first coupling piece and the second coupling piece. The guiding piece is disposed forwardly of and fixed to the second coupling piece.

In accordance with some embodiments of the present disclosure, each of the first coupling piece, the second engaging piece, the second coupling piece, and the guiding piece has two parts which are symmetric with respect to a symmetric plane of the force-transmission unit.

In accordance with some embodiments of the present disclosure, the first engaging piece is a hexagonal nut.

In accordance with some embodiments of the present disclosure, the first coupling piece includes a main plate, two upper ribs, and two lower ribs. The main plate has an upper portion, a lower portion and a middle portion which is located between the upper portion and the lower portion, and which is formed with the through hole. The two upper ribs extend forwardly from the upper portion of the main plate and are spaced apart from each other. The two lower ribs extend forwardly from the lower portion of the main plate and are spaced apart from each other.

In accordance with some embodiments of the present disclosure, the second coupling piece includes a horizontal plate, two upper protrusions, and two lower protrusions. The horizontal plate is configured to be in abutting engagement with the front portion of the second engaging piece so as to permit the front portion of the second engaging piece to be sandwiched between the horizontal plate and the middle portion of the main plate. The two upper protrusions extend upwardly from the horizontal plate so as to permit the two upper ribs to be respectively fixed to the two upper protrusions. The two lower protrusions extend downwardly from the horizontal plate so as to permit the two lower ribs to be respectively fixed to the two lower protrusions.

In accordance with some embodiments of the present disclosure, the guiding piece has a rear marginal portion and a front guiding portion which is opposite to the rear marginal portion. The rear marginal portion has a cutout region so as to permit the horizontal plate to be engaged within the cutout region.

In accordance with some embodiments of the present disclosure, the rear marginal portion has an upper margin region and a lower margin region which are at two opposite sides of the cutout region such that once the horizontal plate is engaged within the cutout region, the upper margin region is sandwiched between the two upper protrusions, and the lower margin region is sandwiched between the two lower protrusions.

In accordance with some embodiments of the present disclosure, the frame unit includes an upper frame, a lower frame and two interconnecting frames. The upper frame is fixed to the cover so as to permit the cover to move with the upper frame. The upper frame has two marginal portions which are opposite to each other in the left-right direction. The lower frame is disposed beneath the treatment device and has two marginal portions which are opposite to each other in the left-right direction. Each of the two interconnecting frames interconnects one of the two marginal portions of the upper frame with a respective one of the two marginal portions of the lower frame.

In accordance with some embodiments of the present disclosure, the translation mechanism includes a guiding groove, a holding element, and an engaging finger. The guiding groove is formed in the guiding piece, and has a front groove end and a rear groove end that is at a level higher than a level of the front groove end. The holding element extends in the front-rear direction to terminate at a front holding end and a rear connecting end. The front holding end is configured to hold the lower frame. The engaging finger extends from the rear connecting end in the left-right direction and is slidably engaged within the guiding groove, such that in response to movement of the force-transmission unit from the rearward position to the forward position, the engaging finger slides from the front groove end to the rear groove end, and the lower frame is lifted up by the holding element, so that the cover moves to the upper position.

In accordance with some embodiments of the present disclosure, the treatment apparatus further includes a guiding rail and a slider. The guiding rail is immovably mounted relative to the cylinder, and extends along a longitudinal axis in the front-rear direction. The longitudinal axis is parallel to and offset from the rod axis. The slider has a mount surface and a guided surface opposite to the mount surface. The guided surface is slidably engaged with the guiding rail. The mount surface is mounted to the force-transmission unit such that in response to movement of the force-transmission unit, the slider is guided by the guiding rail so as to permit the force-transmission unit to be guided by the slider and to permit the guiding rail to move along the rod axis.

In accordance with some embodiments of the present disclosure, the treatment apparatus further includes a base and a board. The base includes a base plate on which the cylinder is immovably mounted, and a side plate extending upwardly from the base plate. The board has a mount surface to which the guiding rail and the side plate are mounted.

In accordance with some embodiments of the present disclosure, the left contour and the right contour are symmetric with respect to a symmetric plane of the force-transmission unit. The mount surface is arranged parallel to the symmetric plane. A distance between the symmetric plane and the mount surface of the board is the same as a distance between the rod axis and the mount surface of the board.

In accordance with some embodiments of the present disclosure, the cylinder has an inner space therein. The actuation device further includes a piston and a seal. The piston is disposed inside the inner space to divide the inner space into a first chamber and a second chamber. The piston has a surface from which the piston rod extends in the second chamber through the cylinder. The seal is disposed between the piston rod and the cylinder. When a pressure inside the first chamber is greater than a pressure inside the second chamber, the piston rod is driven to move to the extended position. When the pressure inside the first chamber is less than the pressure inside the second chamber, the piston rod is driven to move to the retracted position.

In accordance with some embodiments of the present disclosure, the treatment device is a heating device.

In accordance with some embodiments of the present disclosure, a treatment apparatus includes a first treatment device, pins, a cover, a second treatment device, an actuation device, a force-transmission unit, a frame unit, and a translation mechanism.

The first treatment device has a first carrying surface. Pins are movably mounted in the first treatment device between a normal position, where the pins are retracted relative to the first carrying surface, and a protruded position, where the pins are protruded up from the first carrying surface. The cover is disposed on and movable relative to the first carrying surface between a lower position, where the cover is in sealing contact with the first carrying surface to form a sealed chamber, and an upper position, where the cover is spaced apart from the first carrying surface in an upright direction. The second treatment device has a second carrying surface, and is formed with slits such that when the second treatment device is moved onto the first carrying surface, each of the pins is received within a corresponding one of the slits. The actuation device includes a cylinder and a piston rod that extends along a rod axis in a front-rear direction transverse to the upright direction. The piston rod is driven to move relative to the cylinder along the rod axis between an extended position, where an outer end portion of the piston rod is distal from the cylinder, and a retracted position, where the outer end portion of the piston rod is proximate to the cylinder. The force-transmission unit is coupled to move with the piston rod along the rod axis, and is movable between a forward position, where the piston rod is in the extended position, and a rearward position, where the piston rod is in the retracted position. The force-transmission unit has a left contour and a right contour which are opposite to each other in a left-right direction and which are respectively located at two opposite sides of the rod axis. The left-right direction is transverse to the front-rear direction and the upright direction. The frame unit is movable in the upright direction and is fixed to the cover so as to permit the cover to move with the frame unit in the upright direction. The translation mechanism couples the force-transmission unit with the frame unit so as to translate movement of the force-transmission unit in the front-rear direction into movement of the frame unit in the upright direction.

In accordance with some embodiments of the present disclosure, the first treatment device is a heating device, and the second treatment device is a cooling device.

In accordance with some embodiments of the present disclosure, the left contour and the right contour are symmetric with respect to a symmetric plane of the force-transmission unit. The rod axis passes through the force-transmission unit and extends within the symmetric plane.

In accordance with some embodiments of the present disclosure, a treatment apparatus includes a treatment device, pins, a cover, a robot, an actuation device, a force-transmission unit, a frame unit, and a translation mechanism. The treatment device has a carrying surface. Pins are movably mounted in the treatment device between a normal position, where the pins are retracted relative to the carrying surface so as to permit the substrate to be disposed on the carrying surface, and a protruded position, where the pins are protruded up from the carrying surface. The cover is disposed on and movable relative to the carrying surface between a lower position, where the cover is in sealing contact with the carrying surface to form a sealed chamber, and an upper position, where the cover is spaced apart from the carrying surface in an upright direction. The robot is configured to hold a bottom of the substrate so as to place the substrate on the carrying surface when the pins are in the protruded position and the cover is in the upper position. The actuation device includes a cylinder and a piston rod that extends along a rod axis in a front-rear direction transverse to the upright direction. The piston rod is driven to move relative to the cylinder along the rod axis between an extended position, where an outer end portion of the piston rod is distal from the cylinder, and a retracted position, where the outer end portion of the piston rod is proximate to the cylinder. The force-transmission unit is coupled to move with the piston rod along the rod axis, and is movable between a forward position, where the piston rod is in the extended position, and a rearward position, where the piston rod is in the retracted position. The force-transmission unit has a left contour and a right contour which are opposite to each other in a left-right direction and which are respectively located at two opposite sides of the rod axis. The left-right direction is transverse to the front-rear direction and the upright direction. The frame unit is movable in the upright direction and is fixed to the cover so as to permit the cover to move with the frame unit in the upright direction. The translation mechanism couples the force-transmission unit with the frame unit so as to translate movement of the force-transmission unit in the front-rear direction into movement of the frame unit in the upright direction.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A treatment apparatus, comprising:

a treatment device having a carrying surface;

a cover disposed on and movable relative to the carrying surface between a lower position, where the cover is in sealing contact with the carrying surface to form a sealed chamber, and an upper position, where the cover is spaced apart from the carrying surface in an upright direction;

an actuation device which includes a cylinder and a piston rod that extends along a rod axis in a front-rear direction transverse to the upright direction, the piston rod being driven to move relative to the cylinder along the rod axis between an extended position, where an outer end portion of the piston rod is distal from the cylinder, and a retracted position, where the outer end portion of the piston rod is proximate to the cylinder;

a force-transmission unit which is coupled to move with the piston rod along the rod axis, and which is movable between a forward position, where the piston rod is in the extended position, and a rearward position, where the piston rod is in the retracted position, the force-transmission unit having a left contour and a right contour which are opposite to each other in a left-right direction and which are respectively located at two opposite sides of the rod axis, the left-right direction being transverse to the front-rear direction and the upright direction;

a frame unit which is movable in the upright direction and which is fixed to the cover so as to permit the cover to move with the frame unit in the upright direction; and a translation mechanism which couples the force-transmission unit with the frame unit so as to translate movement of the force-transmission unit in the front-rear direction into movement of the frame unit in the upright direction.

2. The treatment apparatus as claimed in claim 1, wherein the left contour and the right contour are symmetric with respect to a symmetric plane of the force-transmission unit, the rod axis passing through the force-transmission unit and extending within the symmetric plane.

3. The treatment apparatus as claimed in claim 1, wherein the outer end portion of the piston rod has a first male-threaded region and a second male-threaded region disposed forwardly of the first male-threaded region, and the force-transmission unit includes:

a first engaging piece having a first female-threaded surface which is configured to permit the first engaging piece to be in threaded engagement with the first male-threaded region;

a first coupling piece disposed forwardly of the first engaging piece, and having a through hole which has a dimension to permit the second male-threaded region to be disposed in the through hole, and to prevent the first engaging piece from moving into the through hole;

a second engaging piece having a rear portion and a front portion, the rear portion having a second female-threaded surface which is configured to permit the rear portion to extend into the through hole and to be in threaded engagement with the second male-threaded region, the front portion having an outer dimension larger than the dimension of the through hole;

a second coupling piece which is disposed forwardly of and fixed to the first coupling piece so as to permit the front portion of the second engaging piece to be sandwiched between the first coupling piece and the second coupling piece; and a guiding piece which is disposed forwardly of and fixed to the second coupling piece.

4. The treatment apparatus as claimed in claim 3, wherein each of the first coupling piece, the second engaging piece, the second coupling piece, and the guiding piece has two parts which are symmetric with respect to a symmetric plane of the force-transmission unit.

5. The treatment apparatus as claimed in claim 3, wherein the first engaging piece is a hexagonal nut.

6. The treatment apparatus as claimed in claim 3, wherein the first coupling piece includes a main plate having an upper portion, a lower portion and a middle portion which is located between the upper portion and the lower portion, and which is formed with the through hole, two upper ribs which extend forwardly from the upper portion of the main plate and which are spaced apart from each other, and two lower ribs which extend forwardly from the lower portion of the main plate and which are spaced apart from each other.

7. The treatment apparatus as claimed in claim 6, wherein the second coupling piece includes a horizontal plate configured to be in abutting engagement with the front portion of the second engaging piece so as to permit the front portion of the second engaging piece to be sandwiched between the horizontal plate and the middle portion of the main plate, two upper protrusions extending upwardly from the horizontal plate so as to permit the two upper ribs to be respectively fixed to the two upper protrusions, and two lower protrusions extending downwardly from the horizontal plate so as to permit the two lower ribs to be respectively fixed to the two lower protrusions.

8. The treatment apparatus as claimed in claim 7, wherein the guiding piece has a rear marginal portion and a front guiding portion which is opposite to the rear marginal portion, the rear marginal portion having a cutout region so as to permit the horizontal plate to be engaged within the cutout region.

9. The treatment apparatus as claimed in claim 8, wherein the rear marginal portion has an upper margin region and a lower margin region which are at two opposite sides of the cutout region such that once the horizontal plate is engaged within the cutout region, the upper margin region is sandwiched between the two upper protrusions, and the lower margin region is sandwiched between the two lower protrusions.

10. The treatment apparatus as claimed in claim 3, wherein the frame unit includes an upper frame fixed to the cover so as to permit the cover to move with the upper frame, the upper frame having two marginal portions which are opposite to each other in the left-right direction, a lower frame disposed beneath the treatment device and having two marginal portions which are opposite to each other in the left-right direction, and two interconnecting frames each of which interconnects one of the two marginal portions of the upper frame with a respective one of the two marginal portions of the lower frame.

11. The treatment apparatus as claimed in claim 10, wherein the translation mechanism includes a guiding groove formed in the guiding piece, and having a front groove end and a rear groove end that is at a level higher than a level of the front groove end, a holding element extending in the front-rear direction to terminate at a front holding end and a rear connecting end, the front holding end being configured to hold the lower frame, and an engaging finger which extends from the rear connecting end in the left-right direction and which is slidably engaged within the guiding groove, such that in response to movement of the force-transmission unit from the rearward position to the forward position, the engaging finger slides from the front groove end to the rear groove end, and the lower frame is lifted up by the holding element, so that the cover moves to the upper position.

12. The treatment apparatus as claimed in claim 1, further comprising:

a guiding rail which is immovably mounted relative to the cylinder, and which extends along a longitudinal axis in the front-rear direction, the longitudinal axis being parallel to and offset from the rod axis; and a slider having a mount surface and a guided surface opposite to the mount surface, the guided surface being slidably engaged with the guiding rail, the mount surface being mounted to the force-transmission unit such that in response to movement of the force-transmission unit, the slider is guided by the guiding rail so as to permit the force-transmission unit to be guided by the slider and to permit the guiding rail to move along the rod axis.

13. The treatment apparatus as claimed in claim 12, further comprising:

a base including a base plate on which the cylinder is immovably mounted, and a side plate extending upwardly from the base plate; and a board having a mount surface to which the guiding rail and the side plate are mounted.

14. The treatment apparatus as claimed in claim 13, wherein:

the left contour and the right contour are symmetric with respect to a symmetric plane of the force-transmission unit;

the mount surface is arranged parallel to the symmetric plane;

a distance between the symmetric plane and the mount surface of the board is the same as a distance between the rod axis and the mount surface of the board.

15. The treatment apparatus as claimed in claim 1, wherein:

the cylinder has an inner space therein;

the actuation device further includes a piston disposed inside the inner space to divide the inner space into a first chamber and a second chamber, the piston having a surface from which the piston rod extends in the second chamber through the cylinder, and a seal disposed between the piston rod and the cylinder;

when a pressure inside the first chamber is greater than a pressure inside the second chamber, the piston rod is driven to move to the extended position; and when the pressure inside the first chamber is less than the pressure inside the second chamber, the piston rod is driven to move to the retracted position.

16. The treatment apparatus as claimed in claim 1, wherein the treatment device is a heating device.

17. A treatment apparatus, comprising:

a first treatment device having a first carrying surface;

pins which are movably mounted in the first treatment device between a normal position, where the pins are retracted relative to the first carrying surface, and a protruded position, where the pins are protruded up from the first carrying surface;

a cover disposed on and movable relative to the first carrying surface between a lower position, where the cover is in sealing contact with the first carrying surface to form a sealed chamber, and an upper position, where the cover is spaced apart from the first carrying surface in an upright direction;

a second treatment device having a second carrying surface, and formed with slits such that when the second treatment device is moved onto the first carrying surface, each of the pins is received within a corresponding one of the slits;

an actuation device which includes a cylinder and a piston rod that extends along a rod axis in a front-rear direction transverse to the upright direction, the piston rod being driven to move relative to the cylinder along the rod axis between an extended position, where an outer end portion of the piston rod is distal from the cylinder, and a retracted position, where the outer end portion of the piston rod is proximate to the cylinder;

a force-transmission unit which is coupled to move with the piston rod along the rod axis, and which is movable between a forward position, where the piston rod is in the extended position, and a rearward position, where the piston rod is in the retracted position, the force-transmission unit having a left contour and a right contour which are opposite to each other in a left-right direction and which are respectively located at two opposite sides of the rod axis, the left-right direction being transverse to the front-rear direction and the upright direction;

a frame unit which is movable in the upright direction and which is fixed to the cover so as to permit the cover to move with the frame unit in the upright direction; and a translation mechanism which couples the force-transmission unit with the frame unit so as to translate movement of the force-transmission unit in the front-rear direction into movement of the frame unit in the upright direction.

18. The treatment apparatus as claimed in claim 17, wherein the first treatment device is a heating device, and the second treatment device is a cooling device.

19. The treatment apparatus as claimed in claim 17, wherein the left contour and the right contour are symmetric with respect to a symmetric plane of the force-transmission unit, the rod axis passing through the force-transmission unit and extending within the symmetric plane.

20. A treatment apparatus for treating a substrate, comprising:

a treatment device having a carrying surface for carrying the substrate thereon;

pins which are movably mounted in the treatment device between a normal position, where the pins are retracted relative to the carrying surface so as to permit the substrate to be disposed on the carrying surface, and a protruded position, where the pins are protruded up from the carrying surface;

a cover disposed on and movable relative to the carrying surface between a lower position, where the cover is in sealing contact with the carrying surface to form a sealed chamber, and an upper position, where the cover is spaced apart from the carrying surface in an upright direction;

a robot which is configured to hold a bottom of the substrate so as to place the substrate on the carrying surface when the pins are in the protruded position and the cover is in the upper position;

an actuation device which includes a cylinder and a piston rod that extends along a rod axis in a front-rear direction transverse to the upright direction, the piston rod being driven to move relative to the cylinder along the rod axis between an extended position, where an outer end portion of the piston rod is distal from the cylinder, and a retracted position, where the outer end portion of the piston rod is proximate to the cylinder;

a force-transmission unit which is coupled to move with the piston rod along the rod axis, and which is movable between a forward position, where the piston rod is in the extended position, and a rearward position, where the piston rod is in the retracted position, the force-transmission unit having a left contour and a right contour which are opposite to each other in a left-right direction and which are respectively located at two opposite sides of the rod axis, the left-right direction being transverse to the front-rear direction and the upright direction;

a frame unit which is movable in the upright direction and which is fixed to the cover so as to permit the cover to move with the frame unit in the upright direction; and a translation mechanism which couples the force-transmission unit with the frame unit so as to translate movement of the force-transmission unit in the front-rear direction into movement of the frame unit in the upright direction.

* * * * *